(12) United States Patent
Bock et al.

(10) Patent No.: US 7,239,400 B2
(45) Date of Patent: Jul. 3, 2007

(54) METHOD AND APPARATUS FOR DETECTING THE POSITION AND THE ORIENTATION OF AN INTERVENTIONAL DEVICE

(75) Inventors: Michael Bock, Heidelberg (DE); Reiner Umathum, Heidelberg (DE); Hans-Joachim Zabel, Heidelberg (DE)

(73) Assignee: Deutsches Krebsforschungszentrum Stiftung Des öffentlichen Rechts, Heidelberg (DE)

( * ) Notice: Subject to any disclaimer, the term of this patent is extended or adjusted under 35 U.S.C. 154(b) by 389 days.

(21) Appl. No.: 10/754,625

(22) Filed: Jan. 12, 2004

(65) Prior Publication Data
US 2004/0199067 A1 Oct. 7, 2004

(30) Foreign Application Priority Data
Jan. 10, 2003 (EP) .................... 03000554

(51) Int. Cl.
*G01B 11/14* (2006.01)
(52) U.S. Cl. ...................... 356/614; 356/364
(58) Field of Classification Search ........ 356/614–623, 356/364–369; 250/227.17, 227.11, 227.31, 250/225; 600/423, 410, 424, 411
See application file for complete search history.

(56) References Cited

U.S. PATENT DOCUMENTS

| 4,572,198 | A | | 2/1986 | Codrington |
|---|---|---|---|---|
| 4,989,608 | A | | 2/1991 | Ratner |
| 5,149,962 | A | * | 9/1992 | Maurice ................ 250/227.17 |
| 5,154,179 | A | | 10/1992 | Ratner |
| 5,211,165 | A | | 5/1993 | Dumoulin et al. |
| 5,318,025 | A | | 6/1994 | Dumoulin et al. |
| 5,375,596 | A | | 12/1994 | Twiss et al. |
| 5,592,939 | A | | 1/1997 | Martinelli |
| 5,719,497 | A | * | 2/1998 | Veeser et al. ................ 324/174 |
| 5,868,674 | A | | 2/1999 | Glowinski et al. |
| 5,882,305 | A | | 3/1999 | Dumoulin et al. |
| 6,223,066 | B1 | | 4/2001 | Govari |
| 6,498,654 | B1 | * | 12/2002 | Cusack, Jr. ................ 356/614 |
| 6,961,608 | B2 | * | 11/2005 | Hoshino et al. ............ 600/423 |
| 2002/0058868 | A1 | | 5/2002 | Hoshino et al. |
| 2005/0029436 | A1 | * | 2/2005 | McElfresh et al. ......... 250/225 |

FOREIGN PATENT DOCUMENTS

WO    WO 02/086526 A1    10/2002

* cited by examiner

*Primary Examiner*—Hoa Q. Pham
(74) *Attorney, Agent, or Firm*—Foley & Lardner LLP

(57) ABSTRACT

The invention relates to a method and an apparatus for measuring the position and the orientation of an interventional device within a magnetic resonance imaging apparatus, the magnetic resonance image apparatus providing a static magnetic field $B_0$ and magnetic field gradients with known magnetic flux densities and directions. The invention includes attaching a Faraday sensor to the interventional device, the Faraday sensor being connected to an optical measuring device. The method also includes using the optical measuring device for measuring the rotation of the plane of polarization of linearly polarized light in the Faraday sensor, while exposing the interventional device: (i) to the static magnetic field $B_0$, and (ii) to the field gradients in all three directions of space in addition to the static magnetic field $B_0$. The method also includes determining the position and the orientation of the interventional device by evaluating the measured rotation of the plane of polarization of the linearly polarized light.

20 Claims, 5 Drawing Sheets

METHOD AND APPARATUS FOR DETECTING THE POSITION AND THE ORIENTATION OF AN INTERVENTIONAL DEVICE

BACKGROUND OF THE INVENTION

A. Field of the Invention

The present invention relates to a method and an apparatus for detecting the position and the orientation of an interventional device, using a Faraday sensor.

B. Description of the Related Art

Modern interventional and surgical procedures aim to treat the affected tissue by causing minimal injury to healthy tissue structures. Special instruments (e.g., a catheter, an endoscope, or a laparoscope) are delivered to the target region via a small-sized (minimal) surgical opening and the affected tissue is treated.

The target of the minimally invasive operation is often not directly visible for an interventionist (i.e., a surgeon), thus the operations are done under imaging guidance. X-ray fluoroscopy, computed tomography, ultrasound and optical endoscopy are currently the most frequently used imaging methods. However, magnetic resonance imaging (MRI) is a state of the art imaging modality for medical diagnostics, and it has the potential to become an excellent guidance method. Knowing the accurate position of the instrument tip inside the patient is essential, since the surgeon has to be able to accurately guide the instrument to the target.

Within an MR-imaging apparatus, interventional device tracking has so far been done either by evaluating the change (gain or loss) of the MR-signal at the position of the interventional device or by attaching an electrical conductor or a high-frequency antenna to the device.

The change of the MR-signal caused by the device itself can only be used to measure the position of the device, if the device is positioned within the imaging frame. Furthermore, if the contrast between the device and its surroundings is too low, it cannot be detected. Visualization of an interventional device could depend upon its being coated with an MR contrast agent, or upon its effect on the MR image by nature of its chemical make-up. However, compounds and materials considered MR-compatible, and even MR contrast agents, can produce significant distortion artifacts that obscure the anatomy and physiology of the imaged tissue. Initial attempts to visualize endovascular devices in MR imaging were based on passive susceptibility artifacts produced by the device when exposed to an MR field. U.S. Pat. No. 5,154,179 and U.S. Pat. No. 4,989,608 disclose the incorporation of paramagnetic material into endovascular devices to make the devices visible under MR imaging.

If the device is connected to an electrical conductor with one or more windings and if these windings are passed by a direct current, a local distortion of the magnetic field of the MR-imaging apparatus is caused. This distortion causes a local alteration of the MR image. By taking two MR images, one with and one without a direct current flowing through the conductor, the position of the interventional device can be determined by the difference of the signals in the two MR images. This method is described in U.S. Pat. No. 5,868,674. Within the magnetic radio frequency field of the MR-imaging apparatus, electric coupling of the wires, which are used as a current supply for the electrical conductor, can lead to severe heating under certain circumstances. If the heat is not dissipated, it might result in a malfunction or even in the destruction of the device, which could be hazardous to the patient.

Another possibility for measuring the position of the interventional device is the application of a high-frequency antenna, which is attached to the device. This antenna is tuned to the resonance frequency of the MR-imaging apparatus. Therefore, the antenna is not compatible to all MR imagers. Furthermore, dangerous RF-heating can take place which can be detrimental to the patient, and the MR technique has to be adapted to this kind of device tracking.

Exemplary of methods for active MR visualization of implanted medical devices is U.S. Pat. No. 5,211,165, which discloses an MR tracking system for a catheter based on transmit/receive microcoils positioned near the end of the catheter by which the position of the device can be tracked and localized. U.S. Pat. No. 5,375,596 discloses a method for locating catheters and other tubular medical devices implanted in the human body using an integrated system of wire transmitters and receivers. U.S. Pat. No. 4,572,198 discloses the use of conductive elements, such as electrode wires, for systematically disturbing the magnetic field in a defined portion of a catheter to yield increased MR visibility of that region of the catheter. However, the presence of conductive elements in the catheter also introduces increased electronic noise and the possibility of Ohmic heating, and these factors have the overall effect of degrading the quality of the MR image and raising concerns about the patient's safety. U.S. Pat. No. 5,882,305 therefore replaces long lead wires, which can cause heating during MR imaging and may distort an MR image, by at least one optical fiber. Consequently, electrical signals have to be converted into modulated optical signals and vice versa by two transducer circuits.

Another possible way of finding the position of an interventional device is to localize it independently of the MR imaging, by using several cameras and light-emitting or reflecting reference marks. For this technique, a free field of view between the reference marks and the cameras is required. Unfortunately, the field of view is very limited when the interventional device is inside a patient's body and when the MR-imaging apparatus is closed.

The present invention is directed to overcoming or at least reducing the effects of one or more of the problems set forth above.

SUMMARY OF THE INVENTION

Accordingly, one aspect of the present invention provides an improved method and apparatus for detecting the position and the orientation of an interventional device, which at least partially overcome the drawbacks mentioned above.

In accordance with this aspect of the present invention, there is provided a method for measuring the position and the orientation of an interventional device within a magnetic resonance imaging apparatus, the magnetic resonance imaging apparatus providing a static magnetic field $B_0$, and magnetic field gradients with known magnetic flux densities and directions, comprising the steps of:

(A) attaching a Faraday sensor to the interventional device, the Faraday sensor being connected to an optical measuring device, (B) using the optical measuring device for measuring the rotation of the plane of polarization of linearly polarized light in the Faraday sensor, while exposing the interventional device (i) to the static magnetic field $B_0$ and (ii) to the field gradients in all three directions of space in addition to the static magnetic field $B_0$, and (C) determining the position and the orientation of the interventional device by evaluating the measured rotation of the plane of polarization of the linearly polarized light.

The method according to at least one aspect of the invention takes advantage of the magnetic fields provided by a magnetic resonance (MR) imaging apparatus. Compared to X-ray systems, which work with significant levels of radiation, MR does not utilize ionizing radiation and there are no known long-term adverse effects on biological tissues from MR, as used in a clinical MR imaging environment.

In step A) of the method according to one aspect of the invention, a Faraday sensor is attached to the interventional device. A Faraday sensor uses the Faraday effect, which exists in the rotation of the plane of polarization of a light beam by a magnetic field. The magnitude of rotation (rotation angle $\Phi$) depends upon the strength of the magnetic field (magnetic flux density B), the length of the transmitting substance l and Verdet constant V, which is a property of the transmitting substance, its temperature and the frequency of the transmitted light. If the light path and the direction of the applied magnetic field are parallel, the plane of polarization is rotated according to the following formula:

$$\Phi = V \, B \, l.$$

If the light path is oriented in an angle $\alpha$ with respect to the direction of the magnetic field, the rotation angle of the plane of polarization is $$\Phi = V \, B \, l \cos \alpha.$$

Therefore, by measuring the angle of rotation $\Phi$ and if V and l are known (and $\alpha=0$), the magnetic flux density of the magnetic field can be determined. Furthermore, by measuring the angle of rotation $\Phi$ and if V, B and l are known, the angle $\alpha$ can be determined. The present invention according to at least one embodiment utilizes these correlations in order to measure the local magnetic field, and thereby the position and orientation of the interventional device, to which the Faraday sensor is attached.

For measuring $\Phi$, an active material, typically a crystal, is placed in a light beam between a polarizer and an analyzer and $\Phi$ is given by the relative angle between the polarizer and the analyzer at maximum light transmission. At a constant angle between the polarizer and the analyzer, the angle of rotation can be determined by measuring the light intensity transmitted by the analyzer, which depends upon the rotation angle $\Phi$. Changes in the magnetic field result in a modulation of the transmitted light and can be measured, e.g., using a fast photo detector. The polarizer, the analyzer and the fast photo detector can be part of the optical measuring device according to at least one embodiment of the present invention.

One advantage of using a Faraday sensor for interventional device tracking is that it does not contain any conducting material. As a result, a dangerous heating of the position sensor is avoided.

In step (B) of the method according to one aspect of the invention, the rotation of the plane of polarization of linearly polarized light in the Faraday sensor is measured with the help of the optical measuring device. As mentioned above, the angle of rotation is a function of the strength of the magnetic field. As a result, measuring the angle of rotation means measuring the strength of the magnetic field, if all other variables are known. According to at least one embodiment of the present invention, the magnetic resonance imaging apparatus provides defined magnetic fields, the strength and direction of which are known and are different at every point of the measurement space. Therefore, the Faraday sensor can be localized by determining the magnetic field strength at its position.

The interventional device (together with the Faraday sensor) is exposed to a static and preferably homogeneous magnetic field $B_0$ (step B) i)) in order to determine its orientation. If the light path inside the Faraday sensor is not parallel to the lines of electric flux of this magnetic field, the rotation of the plane of polarization is different than with the light path and the lines of electric flux being parallel (see above formula). The magnetic field is the same for any position of the Faraday sensor within the static and homogeneous magnetic field $B_0$. Consequently, the angle of rotation $\Phi$ is not dependent upon the position of the Faraday sensor, but only upon the angle $\alpha$ between the direction of the magnetic field and the light path within the sensor.

In other steps (B)(i) and (ii), the interventional device is exposed to field gradients in all three directions of space (x, y and z directions) in addition to the static and preferably homogeneous magnetic field $B_0$. The magnetic field gradient is a variation in the magnetic field with respect to position. By applying field gradients in all three directions (at the same time or one after the other), the three coordinates giving the position of the Faraday sensor (and the interventional device) can be determined. The steps (B) (i) and (B) (ii) can also be carried out in reverse order.

One advantage of the present invention according to at least one embodiment is that no visual contact with the Faraday sensor is necessary. Furthermore, localizing the sensor is not dependent upon MR imaging and the corresponding image formation, since it is carried out only by determining the local magnetic field at the position of the sensor with the help of field gradients.

In a preferred embodiment of the present invention, the Faraday sensor is a reflection type sensor. In this kind of sensor, the light passes through the active material (e.g. the crystal) of the Faraday sensor, is reflected and passes through the active material again in the other direction. The direction of rotation of the plane of polarization is the same for both paths of the light. Therefore, if the same beam of light is reflected back and forth through the active medium, the rotation of its plane of polarization is increased each time. The reflection of the light beam can either take place at a mirror behind the active medium of the Faraday sensor or at the end surface of the active medium itself. The reflection type sensor is advantageous because of its possible miniaturization, allowing the Faraday sensor to be integrated easily into very small interventional devices.

The magnetic resonance imaging apparatus provides the magnetic fields for MR imaging and for the method according to the invention. The magnetic fields applied for MR imaging, particularly the field gradients, are usually very complex. The magnetic fields used for determining the position and the orientation of an interventional device can be chosen much simpler, in order to keep the evaluation of the measured data (in step C)) fairly simple.

In the preferred embodiment of the present invention, the magnetic fields provided by the magnetic resonance imaging apparatus are used for both the MR imaging and the measurement of the position and the orientation of the interventional device. By using the same magnetic fields for both purposes, the time for getting MR images and the information about the position and orientation of the interventional device is reduced. Long scan times limit the applicability of MR-imaging techniques to the general patient population. In particular, long scan times lead to artifacts in the MR images due to involuntary patient movements and motion of the interventional device. Therefore the scan time should be reduced as much as possible.

In the preferred embodiment of the present invention, an image of the interventional device is superimposed upon independently acquired diagnostic images at the position as determined in step C) of the method according to the invention. The position of the interventional device (and possibly its orientation) is displayed on a display device (e.g., a computer monitor) by superposition of a graphic symbol on a conventional MR image. In alternative embodiments of the invention, a graphic symbol representing the interventional device is superimposed on diagnostic images obtained with other imaging systems such as a computer tomography (CT) scanner, an ultrasound scanner or a positron emission tomography (PET) system. Other embodiments of the invention display the position and the orientation of the interventional device numerically or as a graphic symbol without reference to a medical diagnostic image.

Preferably the interventional device, the position and orientation of which are measured according to the present invention, is a guide wire, a catheter, an endoscope, a laparoscope, a biopsy needle, a surgical implement, a therapy delivery implement, an intravascular catheter, a radiofrequency ablation device, a cryo-cooling device or a similar device.

In the preferred embodiment of the present invention, the Faraday sensor is aligned within a static homogeneous magnetic field $B_0$ ($B_0$ as used in step (B)) prior to its use for the method according to at least one aspect of the invention. In this context, aligning means setting a particular angle of orientation a between the direction of the magnetic field and the light path within the sensor, e.g., an angle of 0°. The Faraday rotation angle $\Phi_{cal}$ is measured with the aligned sensor and stored. In step (B)(i) of the method according to at least one aspect of the invention (for example during an interventional procedure), the rotation angle $\Phi_0$ within the static homogeneous magnetic field $B_0$ in the absence of field gradients is determined. From the phase difference $\Phi_0 - \Phi_{cal}$ the actual orientation angle $\alpha$ is computed.

Preferably, in step (B)(ii) of the method according to at least one aspect of the invention, the interventional device is exposed to at least one magnetic field gradient in each direction of space (x,y,z). In a magnetic resonance tomography apparatus the field gradient G is typically designed to modulate the component of the magnetic flux parallel to the static magnetic field $B_0$:

$$B(x,y,z) = B_0 + G_x(t) \cdot x + G_y(t) \cdot y + G_z(t) \cdot z$$

The position of the Faraday sensor (and the interventional device) is then calculated by the difference of the angle of rotation of linearly polarized light caused by the different magnetic field gradients $\Phi_{x,y,z}$ and the rotation angle measured without the presence of the gradients $\Phi_0$:

$$x = \frac{\Phi_x - \Phi_0}{V \cdot l \cdot G_x \cdot \cos\alpha}, \quad y = \frac{\Phi_y - \Phi_0}{V \cdot l \cdot G_y \cdot \cos\alpha}, \quad z = \frac{\Phi_z - \Phi_0}{V \cdot l \cdot G_z \cdot \cos\alpha}.$$

A measurement of the position and orientation of the sensor therefore requires the measurement of four Faraday rotation angles ($\Phi_0$, $\Phi_x$, $\Phi_y$, $\Phi_z$) and an initial calibration of the sensor ($\Phi_{cal}$).

In a further preferred embodiment of the present invention, the relative angle of rotation is increased using a minimum of two magnetic field gradients with opposite polarities in each spatial direction. The two gradients are applied successively and the phase difference is measured.

In yet another preferred embodiment of the present invention, the optical measuring device uses a lock-in technique for measuring the rotation of the plane of polarization of the linearly polarized light in the Faraday sensor caused by the magnetic field gradients. The angle of rotation of the plane of polarization of the linearly polarized light is preferably determined by measuring the light intensity of the linearly polarized light after passing through an analyzer. If the magnetic field, to which the Faraday sensor is exposed, is composed of a strong static magnetic field $B_0$ and a small field gradient, the angle of rotation is mainly influenced by the strong static magnetic field. The small field gradients generate the position information, however, the small position signal is obscured by noise in the received signal. One of the most useful devices for improving the signal-to-noise ratio is a lock-in amplifier. A lock-in amplifier takes a periodic reference signal and a noisy input signal and extracts only that part of the signal whose frequency and phase match the reference. Therefore, the signal to be measured has to be modulated (e.g. chopped) with the reference frequency. For the present invention, the field gradients are modulated with a reference frequency, resulting in a modulated intensity signal of the linearly polarized light after passing through the Faraday sensor and the analyzer.

Furthermore, the present invention according to at least one aspect provides a method for measuring the position and/or the orientation of an object in a measurement space by connecting at least one Faraday sensor to the object, exposing the object to at least one magnetic field with a known direction and a known magnetic flux density, the magnetic flux density being different in every point of the measurement space, measuring the magnetic flux density with the Faraday sensor and assigning the measured magnetic flux density to the position and/or the orientation of the object. The method of detecting the position and orientation of an object within a defined magnetic field with the help of a Faraday sensor is not limited to medical applications within an MR-imaging apparatus. It can also be used for non-medical applications within an MR-scanner or for position detection in a known magnetic field, which is not provided by an MR-imaging apparatus. Examples for non-medical applications within an MR-scanner are materials science investigations with an MR-independent position signal (e.g. studies on parmesan cheese). Position detection with a known magnetic field, which is not provided by an MR-imaging apparatus, can be carried out in a room with special coils for generating the magnetic fields for spatial encoding.

Furthermore, the present invention according to at least one aspect provides an apparatus for detecting the position and the orientation of an interventional device using the method according to the invention, containing at least one Faraday sensor and at least one device for providing a defined magnetic field.

BRIEF DESCRIPTION OF THE DRAWINGS

The foregoing advantages and features of the invention will become apparent upon reference to the following detailed description and the accompanying drawings, of which.

DETAILED DESCRIPTION OF SPECIFIC EMBODIMENTS

Preferred embodiments of the present invention will be described in detail herein, with reference to the accompanying figures.

Figure 1A:
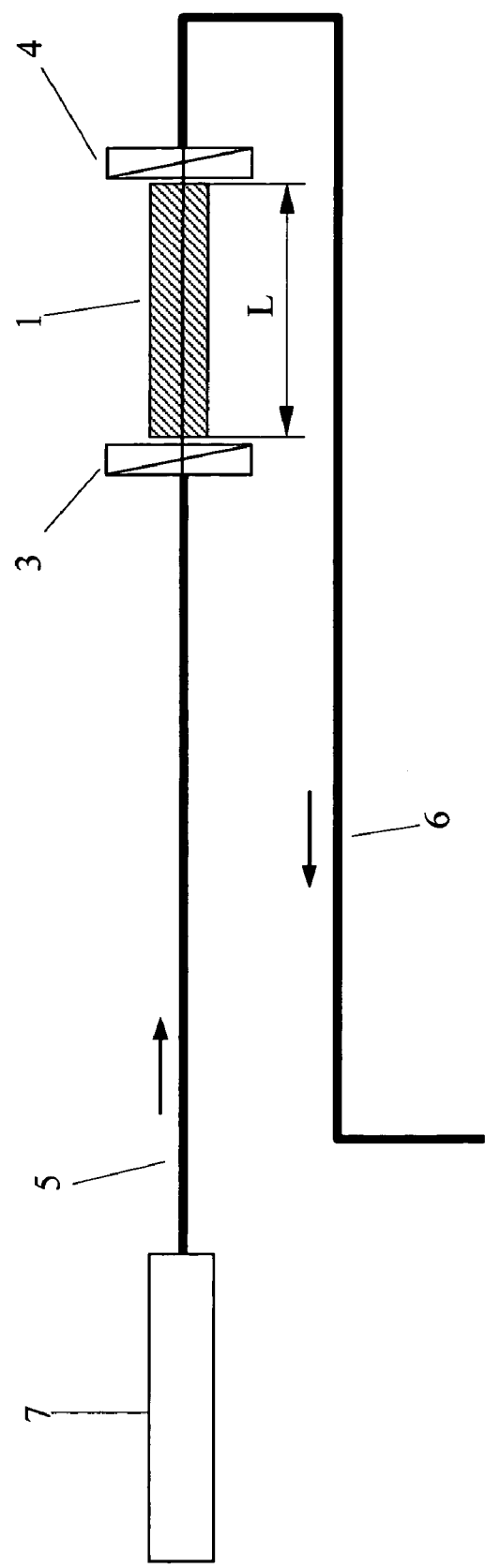
FIG. 1a is a schematic drawing showing an optical measuring device with a transmission type Faraday sensor suitable for the present invention.

FIG. 1a is a diagram of a first embodiment of the present invention. The Faraday sensor as shown in FIG. 1a contains a magneto-optically active medium in the form of a crystal 1. Within a magnetic field, the polarization of a light beam is rotated when the beam is traversing the crystal 1. The rotation angle at the end of the crystal 1 depends upon the length L of the active material, the Verdet constant and the magnetic field strength. To measure the rotation angle, the crystal 1 is placed between a polarizer 3 and an analyzer 4. The polarizer 3 and the analyzer 4 are formed by polarization foils, which are arranged at a constant angle to each other. The optical fiber 5 is used to couple light, which is emitted by a light source 7, into the crystal 1, after having passed through the polarizer 3. A second optical fiber 6 is used to transmit the light beam coming out of the Faraday sensor to a detector (not shown) for measuring the light intensity. The Faraday sensor as shown in FIG. 1a is a transmission type sensor. The light beam passes through this sensor only in one direction.

Figure 1B:
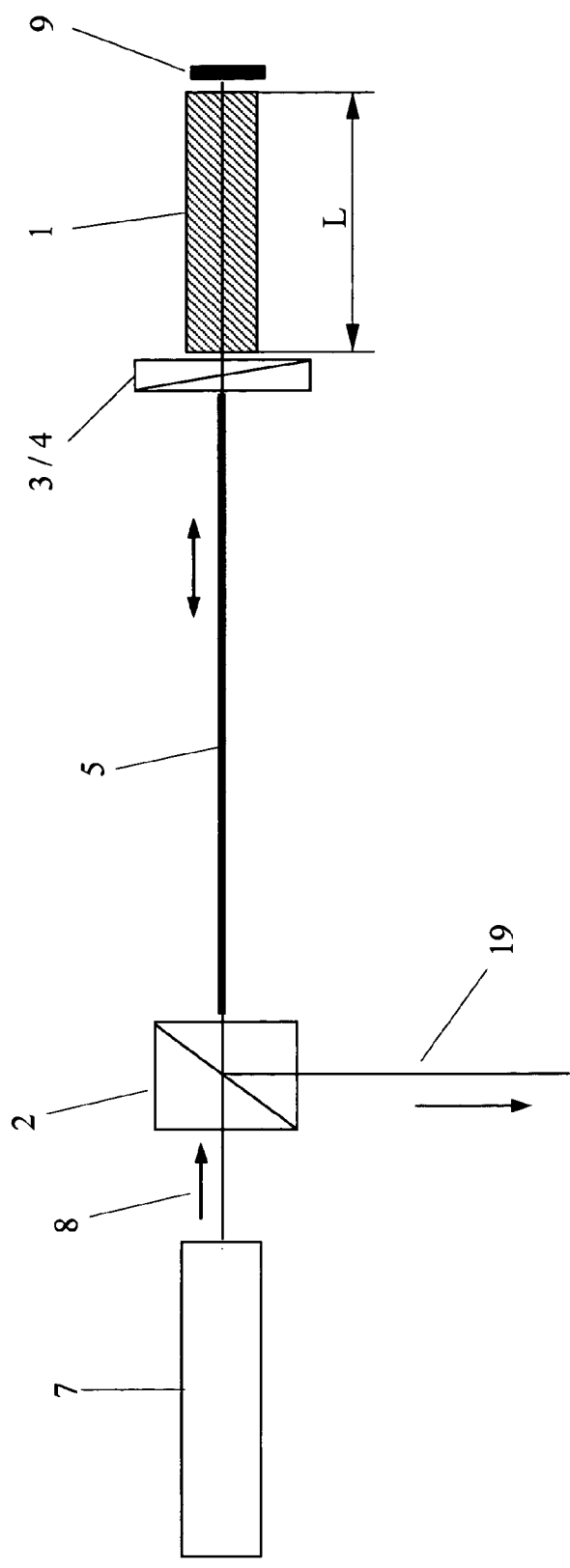
FIG. 1b is a schematic drawing showing an optical measuring device with a reflection type Faraday sensor suitable for the present invention.

In an alternative implementation of the first embodiment, the Faraday sensor is constructed as a reflection type sensor as shown in FIG. 1b. The reflection type sensor has the advantage that the same optical fiber 5 can be used to transmit the light from the light source 7 to the sensor and to guide the reflected light to an external detector (not shown). Furthermore, the rotation angle in a reflection type sensor is doubled as compared to a transmission type sensor of the same length L due to the doubled optical path length. Therefore, a mirror 9 is attached to the end of the crystal 1 to reflect the light coming from the light source 7 passing in a forward direction through the polarizer 3 and the crystal 1. The light reflected by mirror 9 passes in a backward direction through the crystal 1 and the polarizer 3, which now acts as an analyzer 4, and is guided through the fiber 5 to a beam splitter 2. At the beam splitter 2, the reflected light beam is separated from the incident light beam 8. The reflected light beam 19 is then transmitted to a detector (not shown).

Figure 1C:
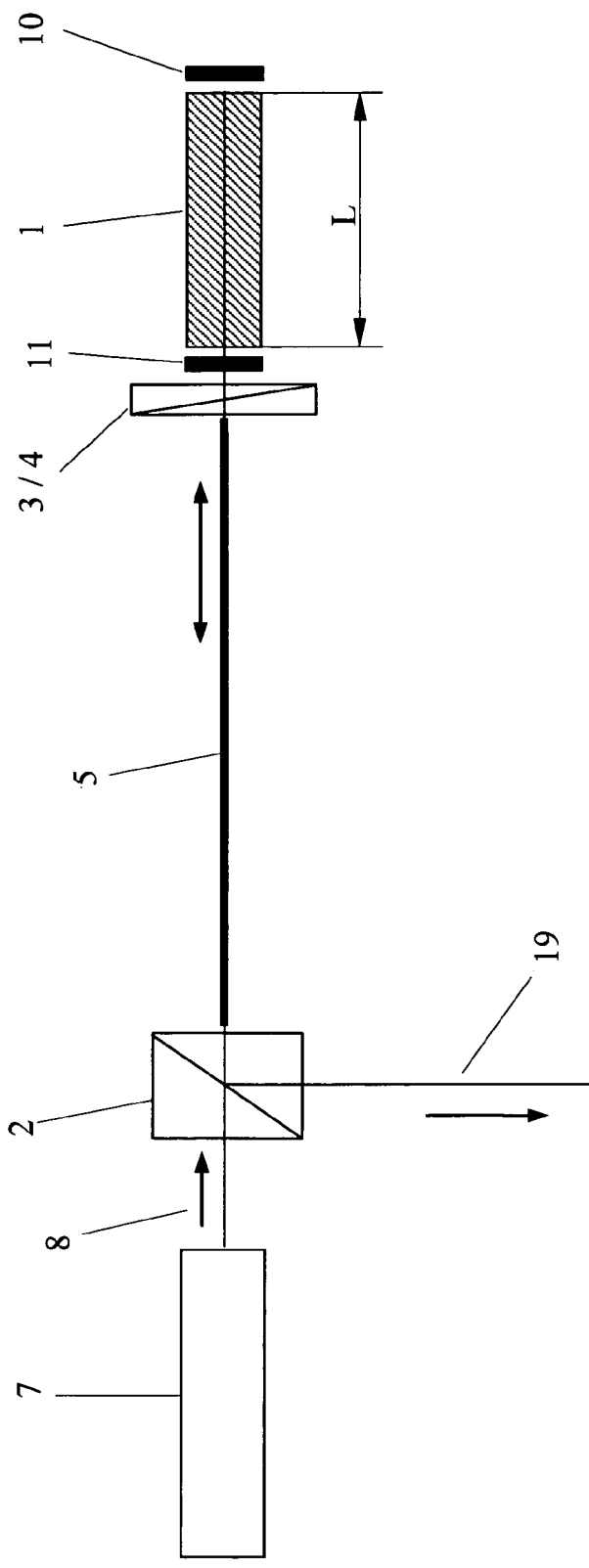
FIG. 1c is a schematic drawing showing an optical measuring device with a transmission type Faraday sensor with an etalon suitable for the present invention.

In an alternative implementation of the first embodiment, the Faraday sensor is constructed as an etalon type sensor as shown in FIG. 1c. The etalon type sensor is a modification of the reflection type sensor shown in FIG. 1b whereby a second, semi-transparent minor 11 is placed between the polarizer 3 and the crystal 1 in addition to the reflecting first mirror 10 at the end of the crystal 1.

In summary, an optical measuring device according to at least one embodiment of the present invention preferably comprises a light source 7, a polarizer 3, an analyzer 4 and a photo detector. The light source 7 is preferably a laser, such as a diode laser. Since the Verdet constant depends upon the frequency of the light passing through the magneto-optically active material, the method according to the first embodiment of the present invention is preferably operated with a monochromatic light source.

In a second embodiment of the present invention, the light source 7 is an intensity-stabilized light source in order to avoid intensity fluctuations of the light beam, whereby those intensity fluctuations would cause errors of measurement. Another possibility of eliminating the unwanted effect of intensity fluctuations of the light beam emitted by the light source 7 would be decoupling part of the light beam to be used in the Faraday sensor without its plane of polarization being rotated in the Faraday sensor, the decoupled light beam serving as a reference beam.

The Faraday sensor is preferably connected to the optical measuring device by at least one optical fiber 5, 6. By using optical fibers 5, 6, the light source 7 and the photo detector can be placed outside of the magnetic fields, advantageously avoiding any influence of the fields on the functioning of these devices. The Faraday sensor according to the second embodiment preferably comprises a crystal 1 containing at least one of the following magneto-optically active materials: terbium-gallium-garnet or rare earth (III) aluminum garnets (see, for example, C. B. Rubinsetin, L. G. Van Uitert, W. H. Grodkiewicz: Magneto-optical Properties of Rare Earth (III) Aluminum Garnets, J. Appl. Phys. 35, 3069–70 (1964)).

Figure 2:
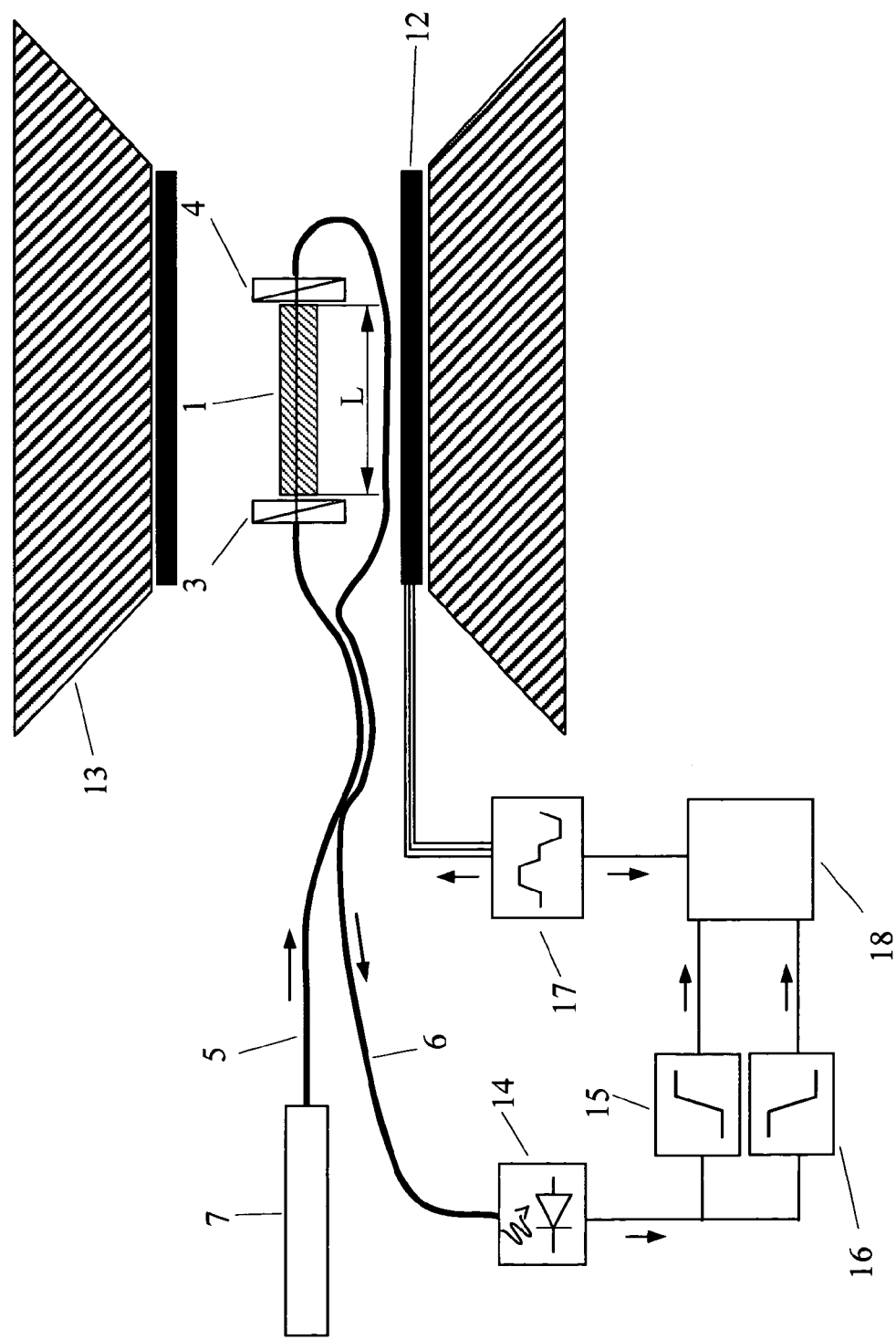
FIG. 2 is a schematic illustration showing an optical measuring device with a transmission type Faraday sensor being suitable for the present invention and FIG. 3 is a timing diagram showing the consecutive measurement steps to determine the orientation and the position of the sensor.

FIG. 2 shows a transmission type Faraday sensor, which is suitable for the present invention, being placed within a static magnetic field and in magnetic field gradients and connected to a signal evaluation unit. A light source 7 emits a beam of light, which passes through an optical fiber 5. The light is coupled into a polarizer 3 and a crystal 1 which turns its plane of polarization in the presence of magnetic fields created by a magnet 13 and by magnetic field gradient coils 12. The transmitted light is passed through an analyzer 4 at the end of the crystal 1. The close proximity of polarizer 3 and analyzer 4 to the crystal 1 ensures that the plane of polarization is not rotated additionally within the optical fibers 5 and 6 which would generate an unwanted additional polarization rotation. If polarization-maintaining fibers are used, taking this measure is not necessary. The light beam at the end of the analyzer 4 is coupled into a second optical fiber 6 which guides the light to the photo detector 14. The photo detector 14 creates a signal proportional to the intensity of the light having passed through the Faraday sensor.

For measuring the orientation of the sensor with respect to the static magnetic field created by the magnet 13 in the absence of magnetic field gradients created by the gradient coils 12, the signal amplitude measured by the photo detector 14 is compared with the signal amplitude measured with the aligned sensor, which is oriented parallel to the static magnetic field.

For measuring the position of the Faraday sensor, a magnetic field gradient in one spatial direction created by the gradient coils 12 is applied. Preferably the gradient amplitude is modulated in the form of a sinusoid (e.g., a sine wave or a cosine wave). The modulated gradient field creates an intensity modulation of the light beam passing through the sensor. To evaluate the amplitude of modulation, the signal output of the photo detector 14 is passed to a lock-in amplifier 18. To eliminate unwanted effects of signal fluctuations, the photo detector signal is passed through a low-pass filter 16 to determine a reference signal which does not show the modulation created by the gradients. This reference signal is used for normalization of the lock-in amplifier signal 18. The photo detector output signal is also passed to the lock-in amplifier 18 through a high-pass filter 15. The high-pass filter 15 is chosen so that the modulation frequency created by the gradient coils 12 is not lost in the filtering process. This signal is then compared in the lock-in amplifier 18 with the modulation signal of the gradients provided by the gradient controller 17. The demodulated and normalized output signal of the lock-in amplifier 18 is a measure of the position along the direction of the applied gradient.

Figure 3:
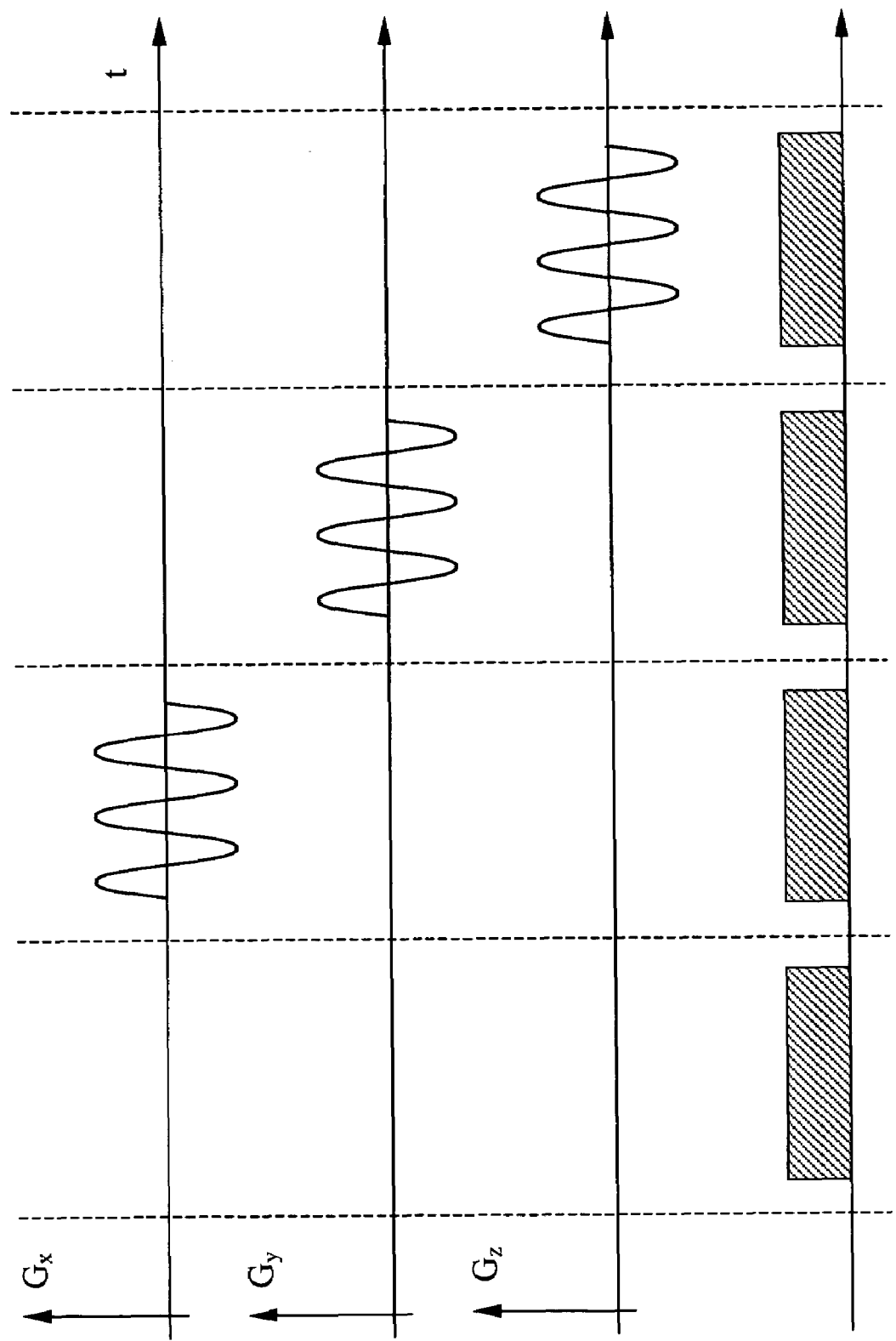

FIG. 3 shows four different measurement steps during the manipulation of the interventional device (and therefore the Faraday sensor) according to an embodiment of the present invention. During a first time period, only the static magnetic field is acting upon the sensor, and the signal at the photo detector is used to determine the orientation of the device. In the next three following time periods, a sinusoidally-modulated waveform is applied to the magnetic field gradient in a first, second and third spatial direction. During each of these time periods, the photo detector signal is evaluated using the lock-in amplifier for signal analysis.

EXAMPLE 1

As the magneto-optically active material for the position sensor, a 7.5 mm-long crystal of Terbium-Gallium-garnet (TGG) was chosen, which offers a high Verdet constant of about 7 deg/T/mm at $\lambda$=675 nm. A diode laser (corresponding to model number DLS15, manufactured by Linos, Germany, in this experiment) was used as a light source and the light was coupled into the crystal through an optical fiber (core diameter: 63 µm) and a polarizing foil. A rotatable analyzer was placed directly behind the crystal and the power of the transmitted light was measured far away from the sensor using again an optical fiber for light transmission and a photo detector (transmission type sensor). Several different experiments were carried out: (a) The sensor was placed at the patient table of a commercial whole body 1.5 T MR scanner (corresponding to Siemens Magnetom Symphony in this experiment) and the Faraday rotation was measured with the sensor as a function of z-position and compared to the magnetic flux measurement of a Hall detector. (b) At the magnet's iso-center the sensor was rotated relative to the $B_0$-field direction and the change in Faraday rotation was assessed. (c) Trapezodial gradients of variable duration (1–2 ms) and amplitude (20 and 30 mT/m) were applied at different positions in the gradient field and the change in light transmission was detected with a lock-in amplifier, which compared the gradient control signal with the signal of the fast photo detector. Since the output power of the laser diode was not constant over the measurement period, the detected signal was normalized to the low frequency component of the laser diode signal.

The magnetic field measurement with the optical sensor showed that the response of the sensor was linear up to $B_0$=1.5 T. At this field strength, a total rotation angle of 65.8° was measured, which corresponds to a measured Verdet constant of 5.9 deg/T/mm. The expected cosine-law for the rotation against the main magnetic field $\Phi$=V L B cos($\alpha$) could be reproduced. The normalized demodulated lock-in amplifier signal $U_n$ showed a linear dependency of the position of the sensor. For a gradient strength of G=30 mT/m, a sensitivity of $(0.31\pm0.02)\times10^{-3}$ was achieved (see FIG. 2), so that with this set-up the precision of the localization is about 1.5 cm. With this sensor, both position and one orientation angle can be measured. Using this technique, e.g., in an intravascular catheter, the sensor can be integrated into an optical fiber and be operated in reflection mode, so that a single fiber can be used and the sensitivity is doubled. Furthermore, special gradient cycles for optical position detection can be incorporated into MRI pulse sequences.

Thus, an apparatus and method have been described according to the present invention. Many modifications and variations may be made to the techniques and structures described and illustrated herein without departing from the spirit and scope of the invention. Accordingly, it should be understood that the methods and apparatus described herein are illustrative only and are not limiting upon the scope of the invention.

What is claimed is:

1. A method for measuring position and orientation of an interventional device within a magnetic resonance imaging apparatus, the magnetic resonance imaging apparatus providing a static magnetic field $B_0$ and magnetic field gradients with predetermined magnetic flux densities and directions, the method comprising:
   (A) attaching a Faraday sensor to the interventional device, the Faraday sensor being connected to an optical measuring device;
   (B) using the optical measuring device for measuring the rotation of the plane of polarization of linearly polarized light in the Faraday sensor, while exposing the interventional device:
      (i) to the static magnetic field $B_0$, and
      (ii) to the field gradients in all three directions of space in addition to the static magnetic field $B_0$; and
   (C) determining the position and the orientation of the interventional device by evaluating the measured rotation of the plane of polarization of the linearly polarized light.

2. The method as claimed in claim 1, wherein the Faraday sensor is one of: a reflection type sensor, an etalon type sensor and a transmission type sensor, and wherein the Faraday sensor is connected to the optical measuring device by at least one optical fiber.

3. The method as claimed in claim 1, wherein the magnetic fields provided by the magnetic resonance imaging apparatus are used for both MR imaging and for the measurement of the position and the orientation of the interventional device.

4. The method as claimed in claim 1, further comprising:
   independently acquiring medical diagnostic images; and
   superimposing an image of the interventional device upon the independently acquired medical diagnostic images at the position as determined in step (C).

5. The method as claimed in claim 1, wherein the optical measuring device comprises one of a light source, a polarizer, an analyzer, and at least one photo detector, and wherein the light source is a diode laser.

6. The method as claimed in claim 1, wherein the Faraday sensor comprises a crystal containing at least one of: magneto-optically active materials, terbium-gallium-garnet, and rare earth aluminum garnets.

7. The method as claimed in claim 1, wherein the interventional device is one of: a guide wire, a catheter, an endoscope, a laparoscope, a biopsy needle, a surgical implement, a therapy delivery implement, an intravascular catheter, a radiofrequency ablation device, and a cryo-cooling device.

8. The method as claimed in claim 1, further comprising:
   exposing the interventional device to at least one magnetic field gradient in each of the three directions of space in step B)ii).

9. The method as claimed in claim 1, further comprising:
measuring, by the optical measuring device by utilizing a lock-in technique, the rotation of the plane of polarization of the linearly polarized light in the Faraday sensor as caused by the magnetic field gradients.

10. The method as claimed in claim 1, wherein the determining step comprises:
applying a magnetic field gradient in one of the three directions of space;
modulating, by way of a sinusoidal modulation signal, the magnetic field gradient;
receiving, by a photo detector, a signal corresponding to an intensity modulation of a light beam passing through the Faraday sensor;
performing high-pass and low-pass filtering of the signal received by the photo detector; and
comparing the filtered signal with the sinusoidal modulation signal to determine the position of the Faraday sensor.

11. An apparatus for detecting the position and the orientation of an interventional device, comprising:
a Faraday sensor coupled to the interventional device;
an optical measuring device coupled to the Faraday sensor, the optical measuring device being configured to measure rotation of a plane of polarization of linearly polarized light in the Faraday sensor, while exposing the interventional device:
(i) to a static magnetic field $B_0$, and
(ii) to field gradients in all three directions of space in addition to the static magnetic field $B_0$; and
a determining unit coupled to the optical measuring device and configured to determine the position and the orientation of the interventional device by evaluating the measured rotation of the plane of polarization of the linearly polarized light.

12. The apparatus as claimed in claim 11, wherein the Faraday sensor is one of: a reflection type sensor, an etalon type sensor and a transmission type sensor, and wherein the Faraday sensor is connected to the optical measuring device by at least one optical fibre.

13. The apparatus as claimed in claim 11, wherein the magnetic fields provided by the magnetic resonance imaging apparatus are used for both MR imaging and for the measurement of the position and the orientation of the interventional device.

14. The apparatus as claimed in claim 11, further comprising:
means for independently acquiring medical diagnostic images; and
means for superimposing an image of the interventional device upon the independently acquired medical diagnostic images at the position as determined by the determining unit.

15. The apparatus as claimed in claim 11, wherein the optical measuring device comprises one of a light source, a polarizer, an analyzer, and at least one photo detector, and wherein the light source is a diode laser.

16. The apparatus as claimed in claim 11, wherein the Faraday sensor comprises a crystal containing at least one of: magneto-optically active materials, terbium-gallium-garnet, and rare earth aluminum garnets.

17. The apparatus as claimed in claim 11, wherein the interventional device is one of: a guide wire, a catheter, an endoscope, a laparoscope, a biopsy needle, a surgical implement, a therapy delivery implement, an intravascular catheter, a radiofrequency ablation device, and a cryo-cooling device.

18. The apparatus as claimed in claim 11, further comprising:
exposing means for exposing the interventional device to at least one magnetic field gradient in each of the three directions of space.

19. The apparatus as claimed in claim 11, wherein the optical measuring device includes means for measuring, by a lock-in technique, the rotation of the plane of polarization of the linearly polarized light in the Faraday sensor as caused by the magnetic field gradients.

20. The apparatus as claimed in claim 11, wherein the determining unit comprises:
an applying unit for applying a magnetic field gradient in one of the three directions of space;
a modulating unit for modulating, by way of a sinusoidal modulation signal, the magnetic field gradient;
a photo detector for receiving a signal corresponding to an intensity modulation of a light beam passing through the Faraday sensor;
a filtering unit for performing high-pass and low-pass filtering of the signal received by the photo detector; and
a comparing unit for comparing the filtered signal with the sinusoidal modulation signal to determine the position of the Faraday sensor.

* * * * *